United States Patent [19]
Sandell

[11] Patent Number: 5,398,030
[45] Date of Patent: Mar. 14, 1995

[54] HIGH-PERFORMANCE SUPERCONDUCTING DIGITAL-TO-ANALOG CONVERTER EMPLOYING DOUBLE-JUNCTION SQUID FLIP-FLOPS

[75] Inventor: Robert D. Sandell, Manhattan Beach, Calif.

[73] Assignee: TRW Inc., Redondo Beach, Calif.

[21] Appl. No.: 171,934

[22] Filed: Dec. 21, 1993

[51] Int. Cl.$^6$ .................. H03M 1/12; H03M 1/66
[52] U.S. Cl. ................... 341/133; 341/149; 341/171
[58] Field of Search ............ 341/133, 149, 171; 505/827

[56] References Cited

U.S. PATENT DOCUMENTS 4,922,250  5/1990  Phillips et al. ............. 341/133
4,956,642  9/1990  Harada ..................... 341/133
5,019,818  5/1991  Lee ........................ 341/133
5,128,675  7/1992  Harada ..................... 341/133
5,192,951  3/1993  Ko ......................... 341/133

Primary Examiner—Sharon D. Logan
Attorney, Agent, or Firm—Sol L. Goldstein

[57] ABSTRACT

A high-performance superconducting digital-to-analog (D/A) converter providing asynchronous high-speed, low-power D/A conversion. The high-performance superconducting D/A converter includes a double-junction superconducting quantum interference device (SQUID) voltage divider circuit, which generates a series of discrete binary voltages, and a double-junction SQUID voltage selector circuit, which selects the binary voltages in accordance with a digital input signal. The currents generated by the selected binary voltages are added together to produce an analog output current that represents the digital input.

14 Claims, 1 Drawing Sheet

HIGH-PERFORMANCE SUPERCONDUCTING DIGITAL-TO-ANALOG CONVERTER EMPLOYING DOUBLE-JUNCTION SQUID FLIP-FLOPS

BACKGROUND OF THE INVENTION

This invention relates generally to digital-to-analog converters and, more particularly, to high-performance superconducting digital-to-analog converters.

High-performance superconducting digital-to-analog (D/A) converters are required in a variety of applications for high-speed, low-power D/A conversion. One such application is digital superconducting flux-locked magnetometers, which provide highly sensitive detection of very small magnetic fields. Digital superconducting magnetometers have been proposed for use in such diverse areas as oil and mineral exploration, submarine and mine detection, and noninvasive medical diagnostic procedures.

A superconducting magnetometer typically employs one or more superconducting quantum interference devices (SQUID's) for measuring the strength of a magnetic field. A SQUID is a superconducting loop having a Josephson tunnel junction as a weak link in the loop. The weak link functions as a flux gate to allow the amount of magnetic flux in the loop to change. The amount of magnetic flux in the superconducting loop is quantized, which means that the loop supports only integer multiples of a flux quantum. When a SQUID is placed in a magnetic field, a superconducting current flows around the loop to oppose any change in the magnetic flux. However, when the opposing current exceeds the critical current of the superconducting loop, the Josephson junction opens the loop and allows one or more flux quantum to enter.

A superconducting magnetometer is constructed by adding a feedback path to a SQUID, thus allowing a current to be applied to the superconducting loop that cancels the current induced by the magnetic field. This maintains the magnetic flux in the loop constant, while the amount of current applied to the loop to balance out the induced current is a measure of the magnetic field. In a digital superconducting magnetometer, a superconducting D/A converter is required in the feedback path to convert the digital feedback signal to an analog current.

Conventional superconducting D/A converters typically employ a binary network of latching Josephson junctions and resistors which generates a set of reference voltages based on the current-voltage characteristics of the junctions. The voltage of a Josephson junction is zero in the superconducting or zero voltage state and equal to the energy gap voltage of the superconducting material in the nonsuperconducting or voltage state. However, using the energy gap voltage as the reference voltage requires uniform Josephson junctions having steep conductances at the gap voltage. The uniformity in the energy gap voltage must be $\frac{1}{2}$ bit greater than $2^N$, which for 10 bits of resolution (N), requires less than a $5 \times 10^{-4}$ variation in the gap voltages of the Josephson junctions, or about one microvolt. The latching nature of conventional superconducting D/A converters also requires synchronous clocking to reset the junctions during each clock cycle, resulting in high power dissipation. Accordingly, there has been a need for a superconducting D/A converter that does not have these drawbacks. The present invention clearly fulfills this need.

SUMMARY OF THE INVENTION

The present invention resides in a high-performance superconducting digital-to-analog (D/A) converter providing asynchronous high-speed, low-power D/A conversion. The high-performance superconducting D/A converter includes a double-junction superconducting quantum interference device (SQUID) voltage divider circuit, which generates a series of discrete binary voltages, and a double-junction SQUID voltage selector circuit, which selects the binary voltages in accordance with a digital input signal. The currents generated by the selected binary voltages are added together to produce an analog output current that represents the digital input.

The voltage divider circuit includes a reference oscillator or clock and N stages of double-junction SQUID flip-flops, where N is the number of bits of the digital input. The divider SQUID flip-flops are connected together in a cascade arrangement and divide a reference voltage $V_0$ into N-1 discrete binary voltages ($V_0/2$, $V_0/4$, $V_0/8$, ..., $V_0/2^{N-1}$). The reference voltage $V_0$ is generated in the most significant bit (MSB) divider SQUID flip-flop by inductively coupling the reference clock signal to the flip-flop. The induced clock signal generates the reference voltage $V_0$ by way of the AC Josephson effect, which fixes the reference voltage to the frequency of the clock signal. The clock frequency can be maintained with good accuracy, thus providing a stable and accurate reference voltage. The voltage selector circuit includes N stages of nonlatching double-junction SQUID flip-flops, where each bit of the digital input is inductively coupled from its bit line to its respective selector SQUID flip-flop.

The high-performance D/A converter of the present invention operates asynchronously due to the use of nonlatching Josephson junctions in the voltage selector circuit. This asynchronous operation eliminates the need for a clock to reset the junctions, thus minimizing power dissipation and output transients due to input changes. The D/A converter operates at high speed, with the selector SQUID flip-flops being toggled at gigahertz rates. The D/A converter has a large dynamic range and requires only N equally matched resistors.

It will be appreciated from the foregoing that the present invention represents a significant advance in the field of superconducting digital-to-analog converters. Other features and advantages of the present invention will become apparent from the following more detailed description, taken in conjunction with the accompanying drawings, which illustrate, by way of example, the principles of the invention.

DETAILED DESCRIPTION OF THE PREFERRED EMBODIMENTS

Figure 1:
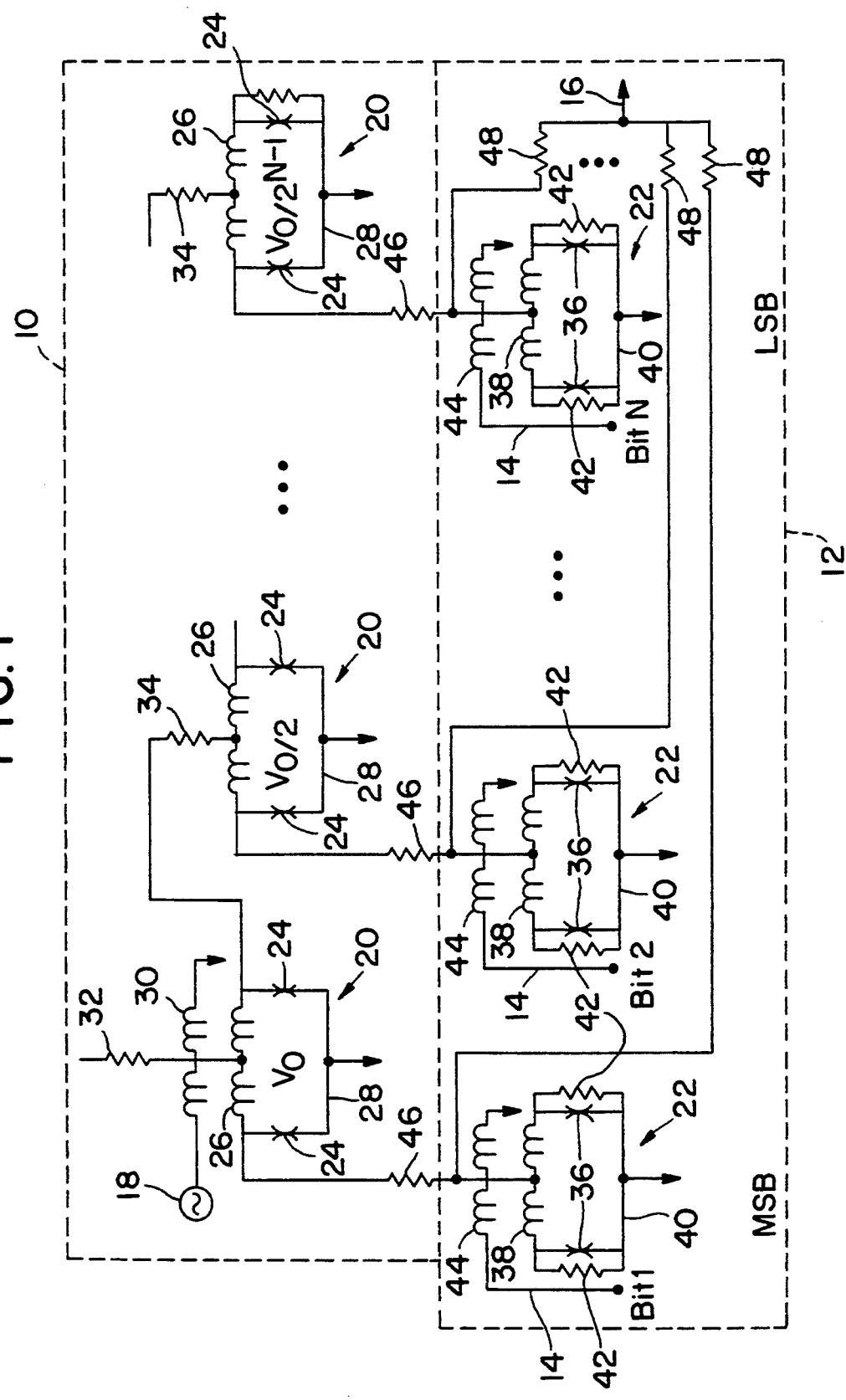
FIG. 1 is a circuit diagram of the high-performance superconducting digital-to-analog converter of the present invention.

As shown in the drawings for purposes of illustration, the present invention is embodied in a high-performance superconducting digital-to-analog (D/A) converter providing asynchronous high-speed, low-power D/A conversion. As shown in FIG. 1, the high-performance superconducting D/A converter of the present invention includes a double-junction superconducting quantum interference device (SQUID) voltage divider circuit 10, which generates a series of discrete binary voltages, and a double-junction SQUID voltage selector circuit 12, which selects the binary voltages in accordance with a digital input signal on bit line 14. The currents generated by the selected binary voltages are added together to produce an analog output current on line 16 that represents the digital input.

The voltage divider circuit 10 includes a reference oscillator or clock 18 and N stages of double-junction SQUID flip-flops 20, where N is the number of bits of the digital input. The divider SQUID flip-flops 20 are connected together in a cascade arrangement and divide a reference voltage $V_0$ into N-1 discrete binary voltages ($V_0/2$, $V_0/4$, $V_0/8$, ..., $V_0/2^{N-1}$). The reference voltage $V_0$ is generated in the most significant bit (MSB) divider SQUID flip-flop 20 by inductively coupling the reference clock signal to the flip-flop. The induced clock signal generates the reference voltage $V_0$ by way of the AC Josephson effect, which fixes the reference voltage to the frequency of the clock signal. The clock frequency can be maintained with good accuracy, thus providing a stable and accurate reference voltage. The reference voltage is $\phi_0 \nu$, where $\nu$ is the clock frequency and $\phi_0$ is a single flux quantum ($\phi_0 = h/2 = 2.07 \times 10^{-15}$ weber, where e is the electron charge and h is Planck's constant). The voltage selector circuit 12 includes N stages of nonlatching double-junction SQUID flip-flops 22, where each bit of the digital input is inductively coupled from the bit line 14 to its respective selector SQUID flip-flop 22.

Each divider SQUID flip-flop 20 includes two Josephson tunnel junctions 24 and a center-tapped inductor 26 connected in a superconducting loop 28. One terminal of each of the Josephson junctions 24 is connected to a different end terminal of the inductor 26 and the other terminal of each of the Josephson junctions 24 is connected to ground. The reference clock signal is inductively coupled to the MSB divider SQUID flip-flop 20 by an inductor 30, and a constant gate current is injected through a resistor 32 into the center-tap terminal of the inductor 26 in the MSB divider SQUID flip-flop 20. The carry junction of each divider SQUID flip-flop 20, except the least significant bit (LSB) divider SQUID flip-flop, is connected through a resistor 34 to the center-tap terminal of the inductor 26 in the next lower-voltage divider SQUID flip-flop 20. The divider SQUID flip-flops 20 operate in the voltage state.

Each selector SQUID flip-flop 22 includes two Josephson tunnel junctions 36 and a center-tapped inductor 38 connected in a superconducting loop 40. One terminal of each of the Josephson junctions 36 is connected to a different end terminal of the inductor 38 and the other terminal of each of the Josephson junctions 36 is connected to ground. A shunt resistor 42 is placed across each Josephson junction 36 so that the selector SQUID flip-flops 22 operate in the nonlatching mode. Each bit of the digital input signal is inductively coupled from the bit line 14 to its respective selector SQUID flip-flop 22 by an inductor 44. The noncarry junction of each divider SQUID flip-flop 20 is connected through a resistor 46 to the center-tap terminal of the inductor 38 in the corresponding selector SQUID flip-flop 22 and through an additional resistor 48 to the analog output on line 16.

Each selector SQUID flip-flop 22 is activated by its respective bit on bit line 14. If the bit line is zero, the selector SQUID flip-flop 22 is flux biased at zero and its output voltage is zero volts. However, when the bit line is high, the selector SQUID flip-flop 22 is flux biased at its operating point and its output voltage is that of its corresponding divider SQUID flip-flop 20 divided by two. The voltage of each divider SQUID flip-flop 20 is cut in half by the selector SQUID flip-flop 22 because the two Josephson junctions 36 in the selector SQUID flip-flop 22 do not toggle at the same time when a pulse comes in on bit line 14. In an alternative embodiment of the present invention, each selector SQUID flip-flop 22 is replaced by a transmission gate, which is a single Josephson junction or SQUID that toggles at the same rate as the noncarry signal from the divider SQUID flip-flop 20. This increases the output voltage by a factor of two.

The high-performance D/A converter of the present invention operates asynchronously due to the use of nonlatching Josephson junctions 36 in the voltage selector circuit 12. This asynchronous operation eliminates the need for a clock to reset the junctions, thus minimizing power dissipation and output transients due to input changes. The D/A converter operates at high speed, with the selector SQUID flip-flops 22 being toggled at gigahertz rates. The D/A converter has a large dynamic range and requires only N equally matched resistors. The device may be fabricated from niobium, niobium nitride, other low-temperature superconducting materials, or high-temperature superconducting materials.

From the foregoing, it will be appreciated that the present invention represents a significant advance in the field of superconducting digital-to-analog converters. Although several preferred embodiments of the invention have been shown and described, it will be apparent that other adaptations and modifications can be made without departing from the spirit and scope of the invention. Accordingly, the invention is not to be limited, except as by the following claims.

I claim:

1. A high-performance superconducting digital-to-analog (D/A) converter providing asynchronous high-speed, low-power D/A conversion, comprising:

a double-junction superconducting quantum interference device (SQUID) voltage divider circuit for generating a series of discrete binary voltages;

a double-junction SQUID voltage selector circuit for selecting the binary voltages in accordance with a digital input; and an output circuit in which currents generated by the selected binary voltages are added together to produce an analog output current that represents the digital input.

2. The high-performance superconducting D/A converter as set forth in claim 1, wherein the voltage divider circuit includes:

a reference clock operating at a reference clock frequency; and

N stages of double-junction divider SQUID flip-flops, where N is the number of bits of the digital input and two of the N stages are a most significant bit (MSB) divider SQUID flip-flop and a least significant bit (LSB) divider SQUID flip-flop corresponding to the most significant bit and the least significant bit, respectively, of the digital input;

wherein the divider SQUID flip-flops are connected together in a cascade arrangement and divide a reference voltage $V_o$ into N-1 discrete binary voltages ($V_o/2$, $V_o/4$, $V_o/8$, ..., $V_o/2^{N-1}$);

and wherein the reference voltage $V_o$ is generated in the most significant bit (MSB) divider SQUID flip-flop by inductively coupling the reference clock to the flip-flop, to provide an induced clock signal and generate the reference voltage $V_o$ by way of the AC Josephson effect, thus fixing the reference voltage to the reference clock frequency.

3. The high-performance superconducting D/A converter as set forth in claim 2, wherein the voltage selector circuit includes N stages of nonlatching double-junction selector SQUID flip-flops, each bit of the digital input being inductively coupled from a bit line to a respective one of the selector SQUID flip-flops.

4. The high-performance superconducting D/A converter as set forth in claim 2, wherein each divider SQUID flip-flop includes two Josephson tunnel junctions, one of which is a carry junction, and a center-tapped inductor connected in a superconducting loop, one terminal of each of the Josephson junctions being connected to a different end terminal of the inductor and the other terminal of each of the Josephson junctions being connected to ground;

and wherein a constant gate current is injected through a resistor into the center-tap terminal of the inductor in the MSB divider SQUID flip-flop and the carry junction of each divider SQUID flip-flop, except the least significant bit (LSB) of the divider SQUID flip-flop, is connected through a resistor to the center-tap terminal of the inductor in a next adjacent divider SQUID flip-flop.

5. The high-performance superconducting D/A converter as set forth in claim 3, wherein each selector SQUID flip-flop includes two Josephson tunnel junctions and a center-tapped inductor connected in a superconducting loop, one terminal of each of the Josephson junctions being connected to a different end terminal of the inductor and the other terminal of each of the Josephson junctions being connected to ground;

and wherein a shunt resistor is placed across each Josephson junction so that the selector SQUID flip-flops operate in a nonlatching mode.

6. The high-performance superconducting D/A converter as set forth in claim 5, wherein each divider SQUID flip-flop has a carry junction and a noncarry junction, and the noncarry junction of each divider SQUID flip-flop is connected through a resistor to the center-tap terminal of the inductor in a corresponding selector SQUID flip-flop and through an additional resistor to the output circuit.

7. A high-performance superconducting digital-to-analog (D/A) converter providing asynchronous high-speed, low-power D/A conversion, comprising:

a voltage divider circuit having N stages of double-junction divider superconducting quantum interference device (SQUID) flip-flops connected together in a cascade arrangement for dividing a reference voltage $V_o$ into N-1 discrete binary voltages ($V_o/2$, $V_o/4$, $V_o/8$, ..., $V_o/2^{N-1}$), N being the number of bits of a digital input, and wherein two of the N stages are a most significant bit (MSB) divider SQUID flip-flop and. a least significant bit (LSB) divider SQUID flip-flop corresponding to the most significant bit and the least significant bit, respectively, of the digital input;

a voltage selector circuit having N states of nonlatching double-junction selector SQUID flip-flops for selecting the binary voltages in accordance with the digital input, each bit of the digital input being inductively coupled from a bit line to a respective one of the selector SQUID flip-flops; and an output circuit in which currents generated by the selected binary voltages are added together to produce an analog output current that represents the digital input.

8. The high-performance superconducting D/A converter as set forth in claim 7, wherein the voltage divider circuit further includes a reference clock operating at a reference clock frequency, for generating a reference voltage $V_o$ in the most significant bit (MSB) divider SQUID flip-flop, the reference clock being inductively coupled to the MSB divider SQUID flip-flop for generating the reference voltage $V_o$ by way of the AC Josephson effect, thus fixing the reference voltage to the reference clock frequency.

9. The high-performance superconducting D/A converter as set forth in claim 7, wherein each divider SQUID flip-flop includes two Josephson tunnel junctions, one of which is a carry junction, and a center-tapped inductor connected in a superconducting loop, one terminal of each of the Josephson junctions being connected to a different end terminal of the inductor and the other terminal of each of the Josephson junctions being connected to ground;

and wherein a constant gate current is injected through a resistor into the center-tap terminal of the inductor in the MSB divider SQUID flip-flop and the carry junction of each divider SQUID flip-flop, except the least significant bit (LSB) divider SQUID flip-flop, is connected through a resistor to the center-tap terminal of the inductor in a next adjacent divider SQUID flip-flop.

10. The high-performance superconducting D/A converter as set forth in claim 7, wherein each selector SQUID flip-flop includes two Josephson tunnel junctions and a center-tapped inductor connected in a superconducting loop, one terminal of each of the Josephson junctions being connected to a different end terminal of the inductor and the other terminal of each of the Josephson junctions being connected to ground;

and wherein a shunt resistor is placed across each Josephson junction so that the selector SQUID flip-flops operate in a nonlatching mode.

11. The high-performance superconducting D/A converter as set forth in claim 10, wherein each divider SQUID flip flop has a carry junction and a noncarry junction, and the noncarry junction of each divider SQUID flip-flop is connected through a resistor to the center-tap terminal of the inductor in a corresponding selector SQUID flip-flop and through an additional resistor to the output circuit.

12. A high-performance superconducting digital-to-analog (D/A) converter providing asynchronous high-speed, low-power D/A conversion, comprising:

a voltage divider circuit for generating a series of discrete binary voltages from a reference voltage $V_o$, the reference voltage being generated by way of the AC Josephson effect using a reference clock operating at a reference clock frequency, thus fixing the reference voltage to the reference clock frequency;

a voltage selector circuit for selecting the binary voltages in accordance with a digital input signal; and an output circuit in which currents generated by the selected binary voltages are added together to produce an analog output current that represents the digital input.

13. The high-performance superconducting D/A converter as set forth in claim 12, wherein the voltage divider includes:

N stages of double-junction divider superconducting quantum interference device (SQUID) flip-flops, where N is the number of bits of the digital input; wherein the divider SQUID flip-flops are connected together in a cascade arrangement and divide the reference voltage $V_o$ into N-1 discrete binary voltages ($V_o/2$, $V_o/4$, $V_o/8$, ..., $V_o/2^{N-1}$).

14. The high-performance superconducting D/A converter as set forth in claim 13, wherein the voltage selector circuit includes N stages of nonlatching double-junction SQUID flip-flops, each bit of the digital input being inductively coupled from a bit line to a respective one of the selector SQUID flip-flops.

* * * * *